(12) United States Patent
Shalvi et al.

(10) Patent No.: US 8,910,021 B2
(45) Date of Patent: Dec. 9, 2014

(54) AUTOMATIC DEFECT MANAGEMENT IN MEMORY DEVICES

(71) Applicant: Apple, Inc., Cupertino, CA (US)

(72) Inventors: Ofir Shalvi, Ra'anana (IL); Naftali Sommer, Rishon Le-Zion (IL); Oren Golov, Hod-Hasharon (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/059,982

(22) Filed: Oct. 22, 2013

(65) Prior Publication Data

US 2014/0047291 A1   Feb. 13, 2014

Related U.S. Application Data

(60) Division of application No. 13/405,309, filed on Feb. 26, 2012, now Pat. No. 8,595,573, which is a continuation-in-part of application No. 11/995,812, filed as application No. PCT/IL2007/001488 on Dec. 3, 2007, now Pat. No. 8,151,163.

(60) Provisional application No. 60/954,013, filed on Aug. 5, 2007, provisional application No. 60/654,012, filed on Aug. 5, 2007, provisional application No. 60/868,731, filed on Dec. 6, 2006, provisional application No. 60/868,342, filed on Dec. 3, 2006.

(51) Int. Cl.

| | | |
|---|---|---|
| *G11C 29/00* | (2006.01) |
| *G06F 11/18* | (2006.01) |
| *G06F 11/10* | (2006.01) |
| *H03M 13/23* | (2006.01) |
| *H03M 13/15* | (2006.01) |
| *H03M 13/11* | (2006.01) |
| *H03M 13/29* | (2006.01) |
| *H03M 13/25* | (2006.01) |

(52) U.S. Cl.
CPC ............ *G06F 11/181* (2013.01); *H03M 13/23* (2013.01); *G06F 11/1044* (2013.01); *H03M 13/1515* (2013.01); *H03M 13/1102* (2013.01); *G06F 11/1076* (2013.01); *G06F 11/1008* (2013.01); *H03M 13/296* (2013.01); *H03M 13/152* (2013.01); *H03M 13/25* (2013.01)
USPC ............ 714/766; 365/200; 714/42; 714/799; 714/718

(58) Field of Classification Search
CPC ........ G06F 11/181; G06F 29/04; G06F 29/48
USPC ............................. 714/718, 25, 42; 365/201
See application file for complete search history.

(56) References Cited

U.S. PATENT DOCUMENTS

| | | | | |
|---|---|---|---|---|
| 5,200,959 | A | * | 4/1993 | Gross et al. .................... 714/723 |
| 5,255,226 | A | * | 10/1993 | Ohno et al. ............... 365/189.12 |
| 5,808,944 | A | * | 9/1998 | Yoshitake et al. ............ 365/200 |
| 6,188,619 | B1 | * | 2/2001 | Jung ............................ 365/200 |

(Continued)

*Primary Examiner* — Esaw Abraham
(74) *Attorney, Agent, or Firm* — Meyertons, Hood, Kivlin, Kowert & Goetzel, P.C.

(57) ABSTRACT

A method for data storage in a memory including multiple memory cells arranged in blocks, includes storing first and second pages in respective first and second groups of the memory cells within a given block of the memory. A pattern of respective positions of one or more defective memory cells is identified in the first group. The second page is recovered by applying the pattern identified in the first group to the second group of the memory cells.

18 Claims, 7 Drawing Sheets

(56) References Cited

U.S. PATENT DOCUMENTS

| | | | |
|---|---|---|---|
| 7,243,273 B2 * | 7/2007 | Lin | 714/718 |
| 7,549,021 B2 * | 6/2009 | Warren, Jr. | 711/119 |
| 2003/0074610 A1 * | 4/2003 | Chen et al. | 714/710 |

* cited by examiner

AUTOMATIC DEFECT MANAGEMENT IN MEMORY DEVICES

CROSS-REFERENCE TO RELATED APPLICATIONS

This application is a divisional of U.S. patent application Ser. No. 13/405,309 filed Feb. 26, 2012, now U.S. Pat. No. 8,595,573, which is a continuation in part of U.S. patent application Ser. No. 11/995,812, filed Jan. 15, 2008, now U.S. Pat. No. 8,151,163, issued Apr. 3, 2012, which is the U.S. national phase of PCT application PCT/IL2007/001488, filed Dec. 3, 2007, which claims the benefit of U.S. Provisional Patent Application 60/868,342, filed Dec. 3, 2006, U.S. Provisional Patent Application 60/868,731, filed Dec. 6, 2006, U.S. Provisional Patent Application 60/954,012, filed Aug. 5, 2007 and U.S. Provisional Patent Application 60/954,013, filed Aug. 5, 2007. The disclosures of all these related applications are incorporated herein by reference.

FIELD OF THE INVENTION

The present invention relates generally to memory devices, and particularly to methods and systems for operating memory devices having defective memory cells.

BACKGROUND OF THE INVENTION

Several types of memory devices, such as Flash memories, use arrays of analog memory cells for storing data. Each analog memory cell stores a quantity of an analog value, such as an electrical charge or voltage, which represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

Some of the memory cells in a memory device may be defective. Several methods and systems for operating memory devices having defective memory cells are known in the art. For example, U.S. Pat. No. 5,877,986, whose disclosure is incorporated herein by reference, describes a system of Flash memory chips with controlling circuits. The system is able to remap and replace defective cells with substitute cells. The remapping is performed automatically as soon as a defective cell is detected. When the number of defects in a Flash sector becomes large, the whole sector is remapped.

As another example, U.S. Pat. No. 6,034,891, whose disclosure is incorporated herein by reference, describes a system, which stores data intended for defective memory cells in a row of a memory array in an overhead location of the memory row. The data is stored in the overhead packet during a write operation, and is read from the overhead packet during a read operation. A defect location table for the row of the memory array is provided to identify when a defective memory cell is addressed. During a write operation, the correct data is stripped from incoming data for storing into the overhead packet. During a read operation, the correct data is inserted from the overhead packet into an output data stream.

U.S. Pat. No. 7,170,802, whose disclosure is incorporated herein by reference, describes a non-volatile memory, in which bad columns in the array of memory cells can be removed. Substitute redundant columns can replace the removed columns. Both of these processes are performed on the memory in a manner that is externally transparent and, consequently, need not be managed externally by the host or controller to which the memory is attached. The bad column can be maintained on the memory. At power up, the list of bad columns is used to fuse out the bad columns.

U.S. Patent Application Publication 2007/0103978, whose disclosure is incorporated herein by reference, describes a memory array having redundant columns. Defective cells are individually remapped to redundant cells in a redundant column. Redundant cells in one redundant column replace defective cells in multiple non-redundant columns. Remapping is done as part of initial test and configuration. The scheme can be implemented by specific hardware or by firmware in the memory controller.

U.S. Pat. No. 5,200,959, whose disclosure is incorporated herein by reference, describes a solid-state memory array that is used to store sequential data in a prescribed order. The memory includes an information list containing addresses and defect types of previously detected defects. A controller can reference the information list so that writing or reading of the data will skip over the defective locations in the memory. New defects may be detected during writing by failure in verification, and those new defects will also be skipped.

U.S. Pat. No. 6,558,967, whose disclosure is incorporated herein by reference, describes a manufacturing method for a multiple-bit-per-cell memory. The method tests memory arrays in the memory and separately sets the number of bits stored per cell in each memory array. Memory arrays that testing proves are accurate when writing, storing, and reading a larger number of bits per cell are set to store more bits per cell, and memory arrays that cannot accurately write, store, or read as many bits per cell are set to store fewer bits per cell.

SUMMARY OF THE INVENTION

A method for data storage in a memory including multiple memory cells arranged in blocks, includes storing first and second pages in respective first and second groups of the memory cells within a given block of the memory. A pattern of respective positions of one or more defective memory cells is identified in the first group. The second page is recovered by applying the pattern identified in the first group to the second group of the memory cells.

In some embodiments, identifying the pattern includes identifying one or more defective bit lines in the given block. Identifying the defective bit lines may include detecting a similarity between respective patterns of the positions of the defective memory cells in multiple word lines of the block. In an embodiment, identifying the defective bit lines includes receiving information indicative of the defective bit lines from a tester that tested the memory. In an embodiment, the first and second groups of the memory cells belong to respective first and second word lines of the given block.

In some embodiments, storing the first and second pages includes storing respective first and second Error Correction Code (ECC) code words. In a disclosed embodiment, applying the pattern includes marking respective bits of the second ECC code word, which are stored in the memory cells of the second group corresponding to the identified pattern, as having low reliability, and recovering the second page includes decoding the second ECC code word based on the bits marked as having the low reliability. In an example embodiment, marking the bits includes specifying the bits as erasures. In another embodiment, marking the bits includes assigning low soft-decoding metrics to the bits.

In some embodiments, the first group equals the second group. In another embodiment, recovery of the second page is performed without identifying the defective memory cells in the second group of the memory cells.

There is additionally provided, in accordance with an embodiment of the present invention, apparatus for data storage including an interface and a processor. The interface is configured to communicate with a memory that includes multiple memory cells arranged in blocks. The processor is configured to store first and second pages in respective first and second groups of the memory cells within a given block of the memory, to identify a pattern of respective positions of one or more defective memory cells in the first group, and to recover the second page by applying the pattern identified in the first group to the second group of the memory cells.

There is also provided, in accordance with an embodiment of the present invention, apparatus for data storage including a memory and a processor. The memory includes multiple memory cells arranged in blocks. The processor is configured to store first and second pages in respective first and second groups of the memory cells within a given block of the memory, to identify a pattern of respective positions of one or more defective memory cells in the first group, and to recover the second page by applying the pattern identified in the first group to the second group of the memory cells.

The present invention will be more fully understood from the following detailed description of the embodiments thereof, taken together with the drawings in which:

DETAILED DESCRIPTION OF EMBODIMENTS

Overview

Figure 1:
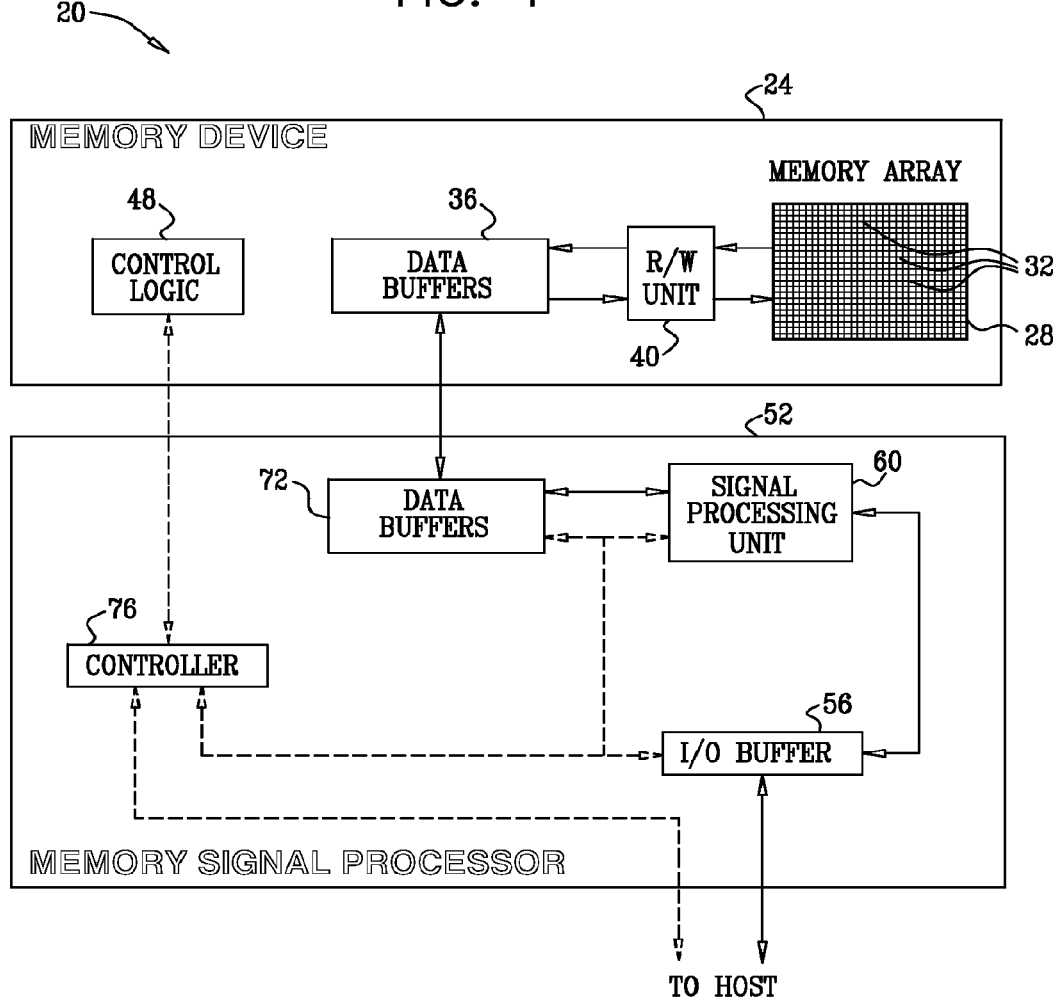
FIG. 1 is a block diagram that schematically illustrates a system for memory signal processing, in accordance with an embodiment of the present invention.

Embodiments of the present invention provide improved methods and systems for operating memory devices having defective memory cells. In the context of the present patent application and in the claims, the term "defective memory cell" is used to describe a memory cell whose stored analog value deviates considerably from the intended target value with high likelihood. Defective cells may comprise, for example, cells that fail to be programmed, i.e., remain stuck at the erased level despite programming attempts, cells that exhibit large programming errors with high likelihood, cells that exhibit large aging errors, and/or cells that fail to store or retain their target values within tolerable bounds for any other reason.

A typical memory device comprises multiple memory cells arranged in blocks. In any given block, the memory cells along each row are connected to a respective word line, and the memory cells along each column are connected to a respective bit line. In some practical scenarios, defective memory cells are caused by failure of one or more bit lines in the block. When a bit line fails, the memory cells along the bit line, belonging to different word lines, will typically become defective. In such a scenario, different pages stored in the word lines in the block will have a similar pattern of defective memory cells.

In some embodiments, a Memory Signal Processor (MSP), which stores data in the memory, uses this feature of bit line failure in recovering data from a faulty memory block. The MSP identifies the positions of one or more defective memory cells in one page and applies the identified pattern of defective memory cells in recovering another page in the block, either in the same word line or in another word line.

In an example embodiment, the MSP stores a first Error Correction Code (ECC) code word in a first page, and a second ECC code word in a second page in the same block. The MSP identifies one or more bit positions in the first ECC code word that correspond to defective memory cells. The MSP then decodes the second ECC code word while applying the identified pattern of bit positions to the second ECC code word. For example, the MSP may mark the bits at the identified positions in the second ECC code word as erasures, or otherwise as having low reliability.

The parent application of this application, U.S. Ser. No. 11/995,812, describes and claims several additional techniques for operating memory cells having defective memory cells. In some embodiments, defective memory cells are identified, during production testing and/or during normal operation of the memory. The defects may be identified by an external tester or by a MSP connected to the memory device. Information regarding the identified defective cells is retained and used by the MSP.

In some embodiments, the MSP sets the configuration in which cells are programmed and/or read based on the information regarding the defective memory cells. For example, defective cells may be skipped. In other embodiments, the MSP encodes the data for storage using an Error Correction Code (ECC), whose level of redundancy is selected based on the identified defective cells. Alternatively, the MSP may mark values read from defective cells before these values go into the ECC decoding process, so that the ECC decoder assigns a low weight to these values.

In some embodiments, defective cells are replaced by substitute cells, which are reserved in the memory device for this purpose. Further alternatively, the memory device may comprise a certain amount of excess memory, which is used for ECC redundancy, cell substitution or both. Some of the methods described herein allocate a portion of the excess memory for substituting defective cells, and the remaining excess memory for increasing ECC redundancy. The allocation may be based on the available information regarding defective cells, as well as on various architectural constraints of the memory device.

The methods and systems described herein enable memory devices having defective cells to provide higher storage capacity and lower error probabilities, in comparison with known methods and systems. Some of the methods described herein modify the operation of the memory device in response to defects that develop during the lifetime of the device, thus providing a high level of operational flexibility and resilience. Moreover, the methods and systems described herein increase the yield and throughput of memory device production processes.

System Description

FIG. 1 is a block diagram that schematically illustrates a system 20 for memory signal processing, in accordance with an embodiment of the present invention. System 20 can be used in various host systems and devices, such as in computing devices, cellular phones or other communication terminals, removable memory modules ("disk-on-key" devices), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and CTF Flash cells, PCM, NROM, FRAM, MRAM and DRAM cells. The charge levels stored in the cells and/or the analog voltages or currents written into and read out of the cells are referred to herein collectively as analog values.

System 20 stores data in the analog memory cells by programming the cells to assume respective memory states. The memory states are selected from a finite set of possible states, and each state corresponds to a certain nominal analog value. For example, a 2 bit/cell MLC can be programmed to assume one of four possible memory states by writing one of four possible nominal analog values into the cell.

Data for storage in memory device 24 is provided to the device and cached in data buffers 36. The data is then converted to analog voltages and written into memory cells 32 using a reading/writing (R/W) unit 40, whose functionality is described in greater detail below. When reading data out of array 28, R/W unit 40 converts the electrical charge, and thus the analog voltages of memory cells 32, into digital samples having a resolution of one or more bits. The samples are cached in buffers 36. The operation and timing of memory device 24 is managed by control logic 48.

The storage and retrieval of data in and out of memory device 24 is performed by a Memory Signal Processor (MSP) 52. MSP 52 comprises a signal processing unit 60, which processes the data that is written into and read from device 24.

In some embodiments, unit 60 encodes the data to be written into the memory cells using an Error Correction Code (ECC), and decodes the ECC of the retrieved data. Unit 60 may use any suitable type of ECC. ECC schemes that may be used by unit 60 may comprise, for example, various block codes such as Bose-Chaudhuri-Hocquenghem (BCH) codes, Reed-Solomon (RS) codes, Low Density Parity Check (LDPC) codes, turbo codes or a turbo product codes (TPC). Alternatively, unit 60 may use a convolutional ECC, a concatenated ECC, a multi-level ECC, a trellis code or other signal-space code, or an ECC that uses coset mapping.

In particular, MSP 52 carries out methods for identifying defective memory cells in array 28, and for storing and retrieving data in the presence of these defects. Several exemplary defect management schemes are described in detail below.

MSP 52 comprises a data buffer 72, which is used by unit 60 for storing data and for interfacing with memory device 24. MSP 52 also comprises an Input/Output (I/O) buffer 56, which forms an interface between the MSP and the host system. A controller 76 manages the operation and timing of MSP 52. Signal processing unit 60 and controller 76 may be implemented in hardware. Alternatively, unit 60 and/or controller 76 may comprise microprocessors that run suitable software, or a combination of hardware and software elements.

The configuration of FIG. 1 is an exemplary system configuration, which is shown purely for the sake of conceptual clarity. Any other suitable configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 52 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which memory array 28 is disposed. Further alternatively, some or all of the functionality of MSP 52 can be implemented in software and carried out by a processor or other element of the host system. In some implementations, a single MSP 52 may be connected to multiple memory devices 24.

In a typical writing operation, data to be written into memory device 24 is accepted from the host and cached in I/O buffer 56. The data is transferred, via data buffers 72, to memory device 24. The data may be pre-processed by MSP 52 before it is transferred to the memory device for programming. For example, unit 60 may encode the data using an ECC, add certain data for internal use, and/or scramble the data. In device 24 the data is temporarily stored in buffers 36. R/W unit 40 converts the data to nominal analog values and writes the nominal values into the appropriate cells 32 of array 28.

In a typical reading operation, R/W unit 40 reads analog values out of the appropriate memory cells 32 and converts them to soft digital samples. The samples are cached in buffers 36 and transferred to buffers 72 of MSP 52. In some embodiments, unit 60 of MSP 52 converts the samples to data bits.

Figure 2:
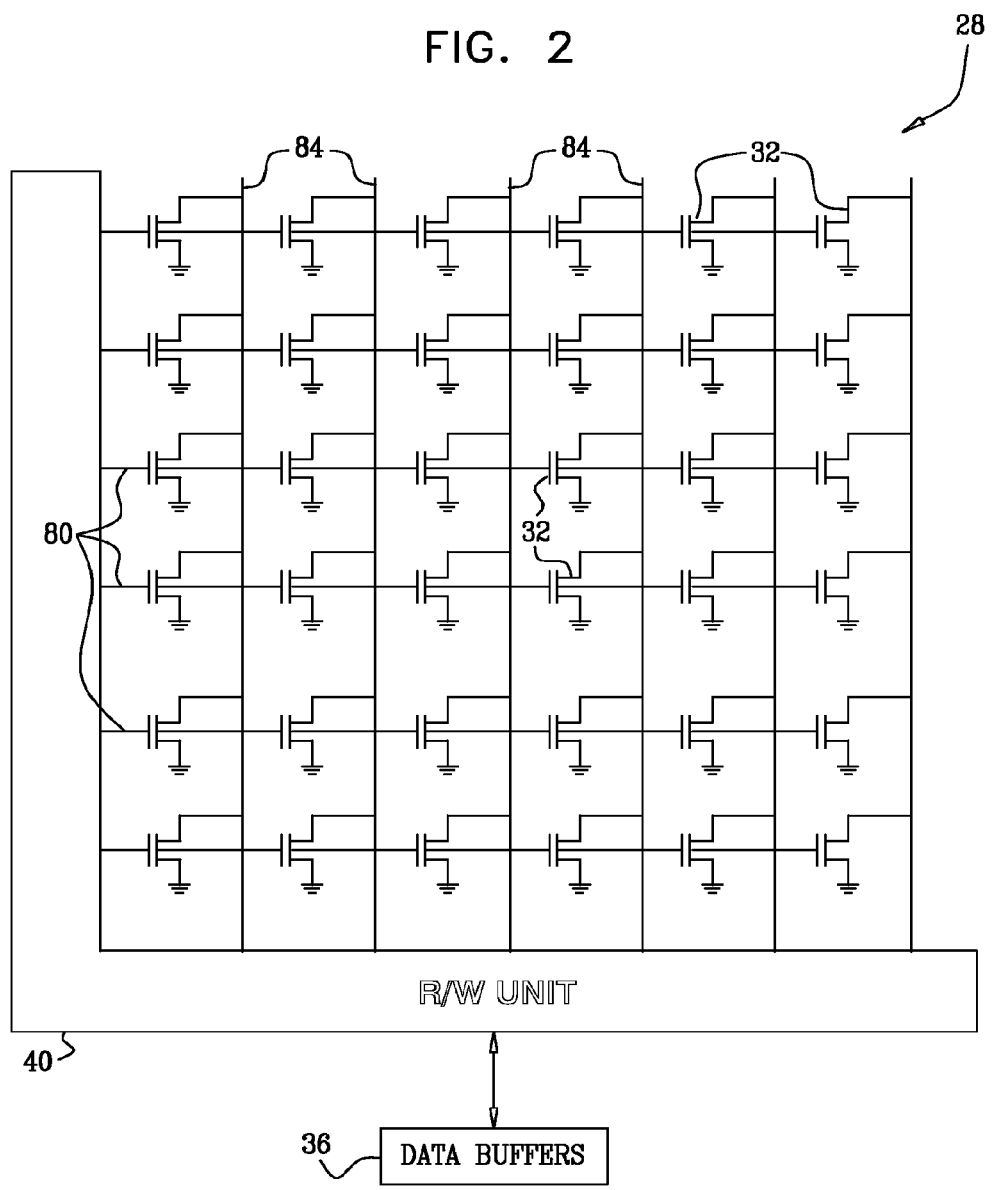
FIG. 2 is a diagram that schematically illustrates a memory cell array, in accordance with an embodiment of the present invention.

FIG. 2 is a diagram that schematically illustrates memory cell array 28, in accordance with an embodiment of the present invention. Although FIG. 2 refers to Flash memory cells that are connected in a particular array configuration, the principles of the present invention are applicable to other types of memory cells and other array configurations, as well. Some exemplary cell types and array configurations are described in the references cited in the Background section above.

Memory cells 32 of array 28 are arranged in a grid having multiple rows and columns. Each cell 32 comprises a floating gate Metal-Oxide Semiconductor (MOS) transistor. A certain amount of electrical charge (electrons or holes) can be stored in a particular cell by applying appropriate voltage levels to the transistor gate, source and drain. The value stored in the cell can be read by measuring the threshold voltage of the cell, which is defined as the minimal voltage that needs to be applied to the gate of the transistor in order to cause the transistor to conduct. The read threshold voltage is indicative of the charge stored in the cell.

In the exemplary configuration of FIG. 2, the gates of the transistors in each row are connected by word lines 80. The sources of the transistors in each column are connected by bit lines 84. In some embodiments, such as in some NOR cell devices, the sources are connected to the bit lines directly. In alternative embodiments, such as in some NAND cell devices, the bit lines are connected to strings of floating-gate cells.

Typically, R/W unit 40 reads the threshold voltage of a particular cell 32 by applying varying voltage levels to its gate (i.e., to the word line to which the cell is connected) and checking whether the drain current of the cell exceeds a certain threshold (i.e., whether the transistor conducts). Unit 40 usually applies a sequence of different voltage values to the word line to which the cell is connected, and determines the lowest gate voltage value for which the drain current exceeds the threshold. Typically, unit 40 reads a group of cells, referred to as a page, simultaneously. Alternatively, R/W unit may use any other technique or circuitry for reading and writing values to and from memory cells 32 of array 28.

The memory cell array is typically divided into multiple pages, i.e., groups of memory cells that are programmed and read simultaneously. In some embodiments, each page comprises an entire row of the array. In alternative embodiments, each row (word line) can be divided into two or more pages. For example, in some SLC devices each row is divided into two pages, one comprising the odd-order cells and the other comprising the even-order cells. Typically but not necessarily, a two-bit-per-cell memory device usually has four pages per row, a three-bit-per-cell memory device has six pages per row, and a four-bit-per-cell memory device has eight pages per row.

Erasing of cells is usually carried out in blocks that contain multiple pages. Typical memory devices may comprise several thousand erasure blocks. In a typical two-bit-per-cell MLC device, each erasure block is on the order of 32 word lines, each comprising several thousand cells. Each word line is often partitioned into four pages (odd/even order cells, least/most significant bit of the cells). Three-bit-per cell devices often have 192 pages per erasure block, and four-bit-per-cell devices often have 256 pages per block. Alternatively, other block sizes and configurations can also be used.

Some memory devices comprise two or more separate memory cell arrays, often referred to as planes. Since each plane has a certain "busy" period between successive write operations, data can be written alternately to the different planes in order to increase programming speed.

Defect Management Method Description

Figure 3:
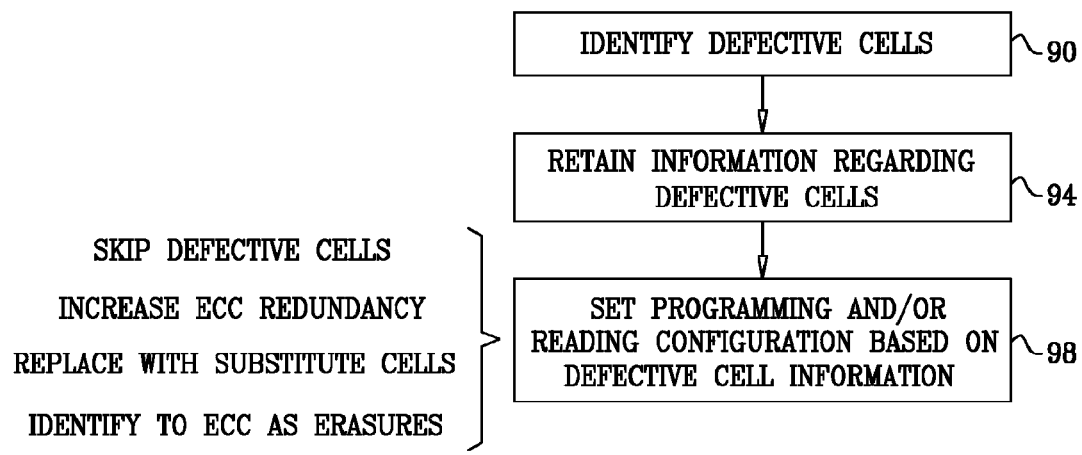
FIG. 3 is a flow chart that schematically illustrates a method for operating a memory having defective memory cells, in accordance with an embodiment of the present invention.

FIG. 3 is a flow chart that schematically illustrates a method for operating a memory having defective memory cells, in accordance with an embodiment of the present invention. The method begins by identifying a subset of memory cells 32 that are defective, at a defective cell identification step 90.

In some embodiments, a production line tester or other suitable test equipment identifies the defective cells during production of memory device 24, such as during wafer testing or final testing of the packaged device. Alternatively, defective cells can also be identified by the MSP during final testing of the device. Additionally or alternatively, the MSP may identify defective cells during operation of the memory device in the host system. Thus, the identified defective memory cells may comprise cells that are initially defective, as well as cells that fail during the lifetime of the memory device.

For example, the MSP may identify defects during normal operation by running a background, low-priority task that tests memory cells in array 28 and attempts to locate defective cells, as described below. The background task may run periodically or occasionally, in parallel to other MSP tasks or when the MSP is idle. The background task may scan the memory sequentially, randomly or in any other suitable order.

In some applications, the supply voltage of the MSP and/or memory device may be switched off from time to time, as is often the case in non-volatile memory systems. Therefore, in some embodiments the MSP occasionally caches interim test results of the background task in non-volatile memory, in order to avoid losing results when the supply voltage is switched off. For example, the MSP may cache information regarding the defective memory cells identified so far in a certain area of array 28, e.g., at periodic intervals. When power is restored, the background task reads the cached interim test results and resumes its operation. The MSP may cache additional data used by the background task, such as memory areas or addresses that were recently scanned, so that the scan can be resumed in a seamless manner.

In some embodiments, the MSP assesses the status of the memory device power supply, and considers the power supply status in determining when to run the background task. For example, in a Disk-on-Key application the MSP may enable the background task when the memory device is plugged into the host system and inhibit the task when the device is disconnected from the host. Additionally or alternatively, the MSP may inhibit the background task when the memory device is in sleep or power save mode, or when a battery used for powering the memory device is low. The background task can be enabled when the memory device is provided with proper power supply.

The MSP can use any suitable method, logic or criteria for determining whether a certain memory cell is functional or defective. For example, the MSP may program the tested memory cell, read the programmed cell, and verify that the read data matches the programmed data. Alternatively, the MSP may compare the analog value written to the cell with the analog value read from the cell and verify that the two values are sufficiently similar. Similarity can be quantified using any suitable metric function, such as absolute difference or Euclidean distance. Defective cells can also be detected by reading from the cells data that is not known a-priori. For example, when using ECC, the MSP may read analog values from a group of cells, decode the ECC, estimate the programmed analog values based on the decoded ECC, and then compare the read analog values to the estimates of the programmed values.

Further alternatively, the MSP may estimate the distortion level in the cell and regard the cell as defective if the distortion level exceeds a certain value. Any suitable method can be used for estimating cell distortion levels. Methods that can be used for this purpose are described, for example, in PCT Patent Application WO 2007/132457, entitled "Combined Distortion Estimation and Error Correction Coding For Memory Devices," PCT Patent Application WO 2007/132453, entitled "Distortion Estimation and Cancellation in Memory Devices," and PCT Patent Application PCT/IL2007/001059, entitled "Estimation of Non-Linear Distortion in Memory Devices," filed Aug. 27, 2007, whose disclosures are incorporated herein by reference.

The MSP may identify defective cells as part of the normal programming, reading and erasing operations. For example, when data is written using a Program and Verify (P&V) process, as is well known in the art, the verification results can be used to assess whether a certain cell is defective or not. For example, a cell that cannot be successfully programmed within a certain number of P&V iterations can be regarded as defective. As another example, a cell that cannot be successfully erased in a certain number of erasure attempts may also be regarded as defective.

When the memory device comprises a multi-level device, the MSP may test the memory cells by programming the cells using only a subset of the possible levels that are widely spaced with respect to one another. For example, in an eight-level (3 bits/cell) device, the MSP may program the cells (e.g., with randomized data) using only the lowest and highest levels out of the eight possible levels. Testing using a small number of widely-spaced levels enables the MSP to differentiate between cells that are entirely defective and defective cells that suffer from high distortion but are still somewhat usable. When this sort of testing is performed using real data intended for storage, the data can later be read and re-programmed at a higher density, e.g., by a background task.

Defective cells that are still usable can be used for storing data at a lower density. Various aspects of storing data at different density levels are addressed, for example, in PCT Patent Application WO 2007/132456, entitled "Memory Device with Adaptive Capacity," whose disclosure is incorporated herein by reference.

Information regarding the identified defective cells is retained, at an information retaining step 94. The retained information may comprise, for example, the locations of the identified defective cells, e.g., plane number, erasure block number, word line number, page number, bit line number, cell index within a page, memory address, or any other suitable means of pointing to or identifying the defective cells. The information may also comprise a severity measure, which indicates whether the cell is completely defective or whether it can still be used with reduced performance.

In some embodiments, the retained information comprises statistical properties or joint properties of certain areas of array 28. For example, the information may comprise the number of defective memory cells identified in each page, word line, bit line or erasure block.

In some embodiments, the MSP stores the information regarding the defective cells in a certain area of memory array 28, such as in a set of pages dedicated for this purpose. Parts of the information that correspond to specific areas of array 28 can be stored in the areas to which they correspond. For example, each memory page of array 28 may comprise one or more cells, which store the number of defective memory cells identified within the page. Such a scheme can also be used, for example, per erasure block or per memory plane. Alternatively, the information may be stored in any other suitable form, such as in a non-volatile memory that is separate from array 28 but located on the same die, or in an internal memory of MSP 52. In some embodiments, the MSP may compress the information using any suitable compression method, in order to reduce storage overhead.

If the cells are identified by test equipment external to the MSP, the test equipment typically provides the information to the MSP using a suitable interface.

MSP 52 sets the configuration used for programming and/or reading data based on the information regarding the defective cells, at a configuration setting step 98. Several exemplary techniques for determining the storage and retrieval configurations are described in detail below. In some of these techniques, defective cells are skipped, and the MSP does not program or read these cells. Other techniques set the level of redundancy of the ECC based on the identified defective cells. Alternatively, the defective cells are indicated to the ECC decoder, and the ECC decoder assigns a low weight to the values read from these cells. In some embodiments, defective cells are replaced by redundant cells, which are reserved for this purpose. Still other methods allocate, based on the identified defective cells, some of the redundant cells for substituting defective cells, and other redundant cells for increasing the ECC redundancy.

The MSP stores and/or retrieves data into and out of array 28 using the determined configuration.

Skipping Defective Memory Cells

In some embodiments, MSP 52 skips the defective memory cells when writing and reading data into and out of the memory array.

Figure 4:
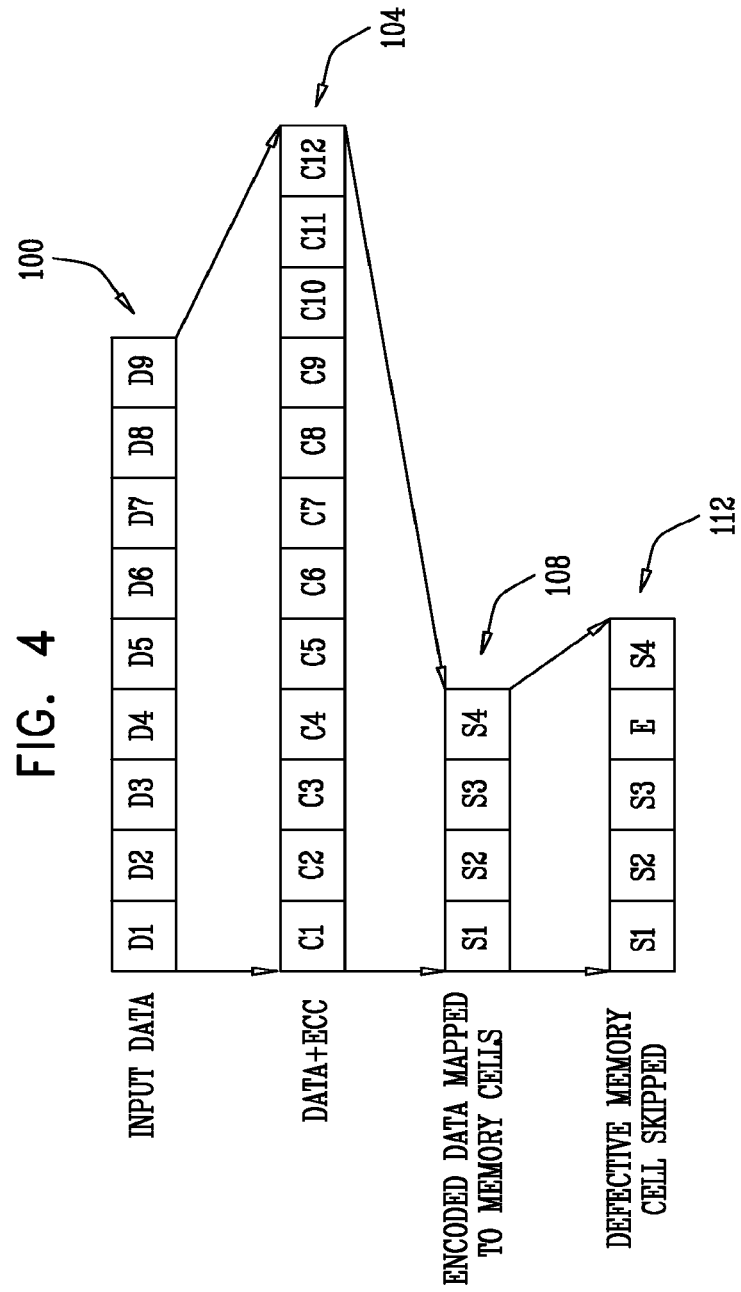
FIG. 4 is a diagram that schematically illustrates a method for skipping defective memory cells, in accordance with an embodiment of the present invention.

FIG. 4 is a diagram that schematically illustrates a method for skipping defective memory cells, in accordance with an embodiment of the present invention. In the present example, signal processing unit 60 accepts nine data bits 100, denoted D1 . . . D9. Unit 60 encodes the data bits using ECC, to produce twelve encoded bits 104, denoted C1 . . . C12.

In the present example, the memory cells comprise 3 bit/cell cells. Unit 60 thus maps the twelve encoded bits to four analog values 108, denoted S1 . . . S4. Each of the four analog values is selected from a set of eight possible values, and therefore stores three bits.

The MSP stores the analog values in memory cells 112. Typically but not necessarily, different bits in a multi-level cell may correspond to different memory pages. In the present example, the Least Significant Bits (LSB) of cells 112 may correspond to a certain page, the middle bits may correspond to another page, and the Most Significant Bits (MSB) may correspond to a third page. Alternatively, any other suitable mapping of pages to bits can also be used.

Normally, the MSP would store the four analog values in four successive memory cells. In the present example, however, one of the memory cells in which the values were intended to be stored is identified as defective. Therefore, unit 60 skips this cell (denoted E in the figure) and stores the fourth analog value in the next functioning cell.

When reading data out of the memory cells, unit 60 similarly skips the defective cell, so as to read the four analog values from the cells in which they were stored.

Skipping defective memory cells enables storing the data only in cells that are fully functional without compromising error performance. Thus, the error correction capability of the ECC can be reserved for correcting errors that appear with low likelihood (e.g., errors caused by distortion), rather than using these resources to correct errors that appear with high likelihood or even deterministic errors, which can be identified and dealt with in advance. When the number of defective cells in a certain page is large, this method can cause slight capacity degradation. Thus, in some embodiments the number of cells in each page can be somewhat increased to account for possible defects.

Setting ECC Redundancy Level Based on Identified Defective Cells

In some embodiments, the MSP selects the ECC used to encode and decode the data based on various characteristics of the identified defective cells. In particular, the MSP may match the level of ECC redundancy to the number of decoding errors expected to be caused by defective cells.

For example, the MSP may cache, or otherwise obtain, the number of defective cells identified in each page of array 28. The MSP then selects an ECC for encoding the data in each page based on the number of defective cells in the page. The MSP encodes the data for storage in the page using the selected ECC. Note that data is stored in the entire page, regardless of the presence of the defective cells. Thus, data bits stored in defective cells are likely to cause reading errors when the data is retrieved.

Typically, a page having a small number of defective cells will be assigned a low-redundancy (high coding rate) ECC by the MSP. A page that contains a large number of defective cells will be assigned a high-redundancy (low coding rate) ECC, in order to enable the ECC to successfully correct the errors caused by the defective cells.

The MSP can use any suitable method for controlling the level of ECC redundancy. For example, the MSP may add a varying number of redundancy bits to each page, as needed. Alternatively, the MSP may switch from one type of ECC to another (e.g., between BCH and LDPC), so as to increase or decrease the redundancy level.

By controlling the level of ECC redundancy, the MSP may also modify the robustness of the ECC to the type of errors that occur in the defective cells. For example, the deviations of the analog values read from the cells from the expected target values are usually relatively small in functional cells and may be very large in defective cells. Some error correction schemes, such as trellis codes, perform well against small deviations but fail to correct large deviations. Other error correction schemes, such as Reed-Solomon, BCH and Hamming block codes, perform well against both large and small deviations. In some embodiments, the MSP can choose the ECC type, e.g., select whether to use a trellis code or a block code, based on the number and type of defective cells.

As another example, PCT Application Publication WO 2007/132458, entitled "Memory Device Programming using Combined Shaping and Linear Spreading," whose disclosure is incorporated herein by reference, describes a method that filters the data in manner that mitigates the effect of large deviations, such as the deviations caused by manufacturing defects. In some embodiments, the MSP may revert to use such filtering methods upon determining that the number of defective cells is high.

In some embodiments, the MSP may use different ECCs having different levels of redundancy for different bits in the same page. In some applications, certain data bits may be more sensitive to errors than others. For example, the data may be encoded using an ECC that uses coset mapping, such as a trellis code, or an LDPC or turbo code that uses coset mapping. Bits that are within a certain coset may be particularly sensitive to large deviations in the cell values, which occur with high likelihood in defected cells. Thus, in some embodiments the MSP uses a higher level of redundancy for the sensitive bits than for other bits.

Indicating Defective Cells to the ECC Decoding Process

In some embodiments, the MSP uses an ECC decoding process, which takes into account quality metrics or other indications as to the reliability or confidence of the input values. Any suitable indication can be used for this purpose, such as, for example, Log-Likelihood Ratios (LLR) of certain bits, parameters of likelihood functions used with maximum-likelihood decoders, and various other weighting functions. In particular, some ECC decoders accept indications in the form of erasures. An erasure typically comprises an indication that a specific input value is uncertain (i.e., conveys little or no information as to the stored data) and should be given little or no weight in the decoding process.

The MSP may use such indications to improve the performance of the ECC decoding process. For example, the MSP may indicate to the ECC decoding process which of the input analog values was read from a defective cell. The MSP may assign the analog values read from defective cells a relatively low metric value, in comparison with values read from functional cells. Alternatively, the MSP may mark the values read from defective cells as erasures to the ECC decoder.

When retrieving data, unit 60 decodes the ECC based on the indications described above. By means of the indications, the ECC decoding process assigns little or no weight to the values read from defective cells, and its decoding performance is therefore improved.

Trading-Off Cell Substitution and ECC Redundancy

In some embodiments, each page or word line of the memory array comprises a certain number of excess memory cells, expressly for redundancy purposes. For example, a 2 Kbyte page may have another 128 bytes of excess memory. Excess memory cells can generally be allocated to two possible mechanisms: (1) substituting memory cells that were identified as defective, and (2) providing additional memory space for ECC redundancy. When a certain excess cell substitutes a defective memory cell, any memory access operation (e.g., read, write or erase) addressed to the defective cell will actually be applied to the substitute cell. When using excess memory cells to increase the ECC redundancy, the excess cells can be used for storing additional parity bits of the ECC. Alternatively, the excess cells can be used together with the nominal page or word line to store a longer code word.

The specific architecture of the memory array often imposes constraints on the allocation of excess memory cells. For example, the number of excess memory cells in a certain page or word line is usually limited, so that allocating memory cells for one-to-one substitution limits the ability to increase the ECC redundancy level, and vice versa. Moreover, in some memory configurations, excess memory cells cannot substitute defective cells on an individual cell-by-cell basis, but only in larger groups of cells. For example, some memory devices comprise excess erasure blocks, excess bit lines, excess word lines or excess NAND strings, which can only be substituted en-bloc.

In some embodiments, MSP 52 allocates a portion of the available excess memory cells for cell substitution and another portion for enhancing the ECC redundancy. The MSP allocates excess memory cells to the two mechanisms based on the available information regarding defective memory cells. If applicable, the MSP makes these allocation decisions based on the additional architectural constraints described above.

The MSP may use a wide variety of rules, policies and criteria for making allocation decisions. For example, when the memory can only substitute entire cell groups (e.g., bit line or NAND string) en-bloc, the MSP may determine the number of defective cells in each cell group, and substitute only cell groups whose number of defective cells is larger than a certain threshold. The remaining excess memory cells are allocated to ECC redundancy enhancement. As another example, the MSP may examine the word lines in which the number of defects exceeds a certain threshold. The MSP can then determine and replace the minimum number of bit lines, which reduces the number of defects in the examined word lines below the threshold.

As yet another example, the MSP may regard a page in which the number of defects exceeds the correction capability of the ECC as a bad page, and determine a trade-off between ECC redundancy and cell substitution that minimizes the number of bad pages. This process may be carried out iteratively by (1) initially allocating all excess memory to ECC redundancy and calculating the number of bad pages, (2) gradually reallocating portions of excess memory to cell substitution and recalculating the number of bad pages, and (3) continuing to transfer excess memory to cell substitution until the optimum point (i.e., an allocation having a minimum number of bad pages) is found.

The allocation of excess memory cells to ECC redundancy and cell substitution can be performed during production and/or during normal operation of the memory device. For example, an external tester or the MSP may identify the defective cells. The tester or the MSP can then allocate the excess cells to the two mechanisms based on the identified defective cells and any applicable architectural constraints. The memory device at the output of the production line will be configured with the appropriate ECC and cell substitution configuration, per the identified defects.

Alternatively, the MSP may identify defective cells during operation of the memory device, and perform excess cell allocation in real time. Hybrid configurations in which an initial excess cell allocation is determined in production and later refined or adapted during normal operation, are also feasible.

Excess cells can be connected, or otherwise configured, to substitute defective cells using any suitable method known in the art. Several methods are described, for example, in some of the references cited in the Background section above. For example, interconnections to substitute cells or cell groups can be fused using laser fusing techniques. Alternatively, the memory device may comprise suitable switching or multiplexing circuitry for replacing defective cells or cell groups with respective excess cells.

Further alternatively, the memory device may provide slightly larger pages, without physically dividing the page to nominal cells and excess cells in any way. The MSP can regard some of the cells in the page as nominal cells, and others as excess cells. For example, the MSP may modify the order in which data is written to the page, so that data that was intended for storage in a defective cell will be stored in another cell, which is regarded as an excess cell. When reading the page, the MSP applies the inverse operation. Thus, the MSP can provide "virtual excess cell" functionality to legacy memory devices having no specific hardware assignment of excess cells or cell groups.

In some embodiments, the memory device may comprise multiple sections of excess memory, which can be assigned to ECC redundancy or to cell substitution. Each of the multiple excess sections can be assigned en-bloc either to ECC redundancy or to cell substitution. The excess memory sections may all have the same size or they may have different sizes. For example, each data page of a memory device may have 2 Kbytes of nominal memory, plus eight additional 16-byte excess memory sections. In alternative embodiments, any other suitable page size and excess memory size may be used.

Figure 5:
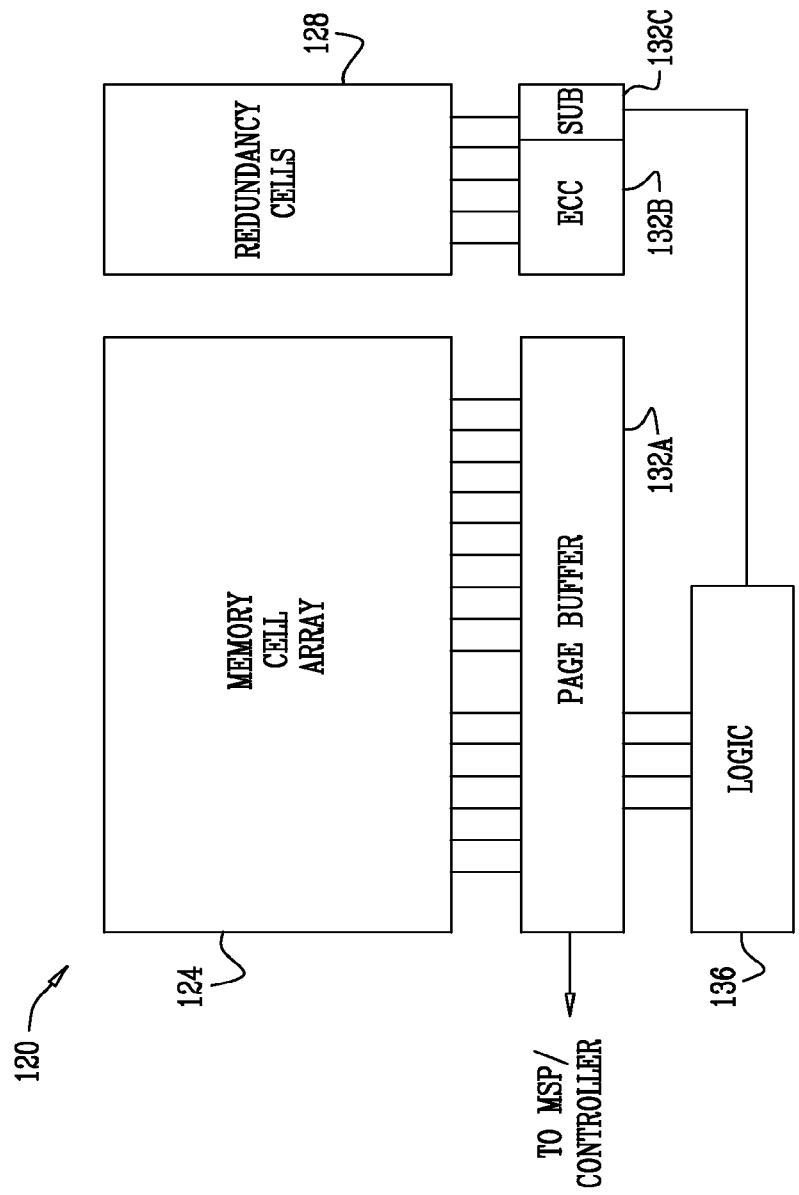
FIG. 5 is a block diagram that schematically illustrates a memory device, in accordance with an embodiment of the present invention.

FIG. 5 is a block diagram that schematically illustrates a memory device 120, in accordance with an embodiment of the present invention. In the present example, the allocation of excess memory cells to ECC enhancement and/or cell substitution is carried out internally to the memory device, typically in hardware.

Device 120 comprises a memory cell array 124, and a corresponding array of redundancy (excess) memory cells 128. Excess memory cells 128 are arranged in columns, so that each column of excess cells can substitute a column of array 124. Any column of the excess memory cells can be assigned either to column substitution or to increasing ECC redundancy.

Values that are read from and written to arrays 124 and 128 are cached in buffers 132A . . . 132C. Buffer 132A holds a page of array 124 that is currently accessed. Buffer 132B holds the excess memory cells that correspond to the accessed page and that are currently allocated to ECC redundancy. Buffer 132C holds the excess memory cells corresponding to the accessed page that are currently allocated to cell substitution.

A logic circuit 136 controls buffers 132A . . . 132C, and in particular allocates each excess cell columns to one of the buffers. As a result, logic 136 can modify the portion of the excess cell columns that are allocated to ECC and to cell substitution.

The configuration of FIG. 5 shows logic circuit 136 as part of memory device 120. In alternative embodiments, however, the decision logic may reside externally to the memory device, such as in the MSP. Assume, for example, that page buffer 132A comprises N bits, that Nb bits are allocated for ECC redundancy and that Nc bits are allocated for substituting defective bits in the memory cell array. During programming, the MSP initially sends the N data bits to buffers 132A . . . 132C, followed by the Nb redundancy bits and the Nc data bits that are to be programmed to defective bit positions. When reading the cells, the MSP reads all three memory buffers 132A . . . 132C, copies the last Nc bits read from buffer 132C into the original positions in the page, and decodes the ECC using the Nb bits read from buffer 132B. Thus, in the present example the MSP reads data from buffer 132A, as well as excess data from buffers 132B and 132C. The MSP replaces data read from buffer 132A with data read from buffer 132C and then applies ECC decoding.

Separate Excess Memory for Internal and External Memory Controllers

Figure 6:
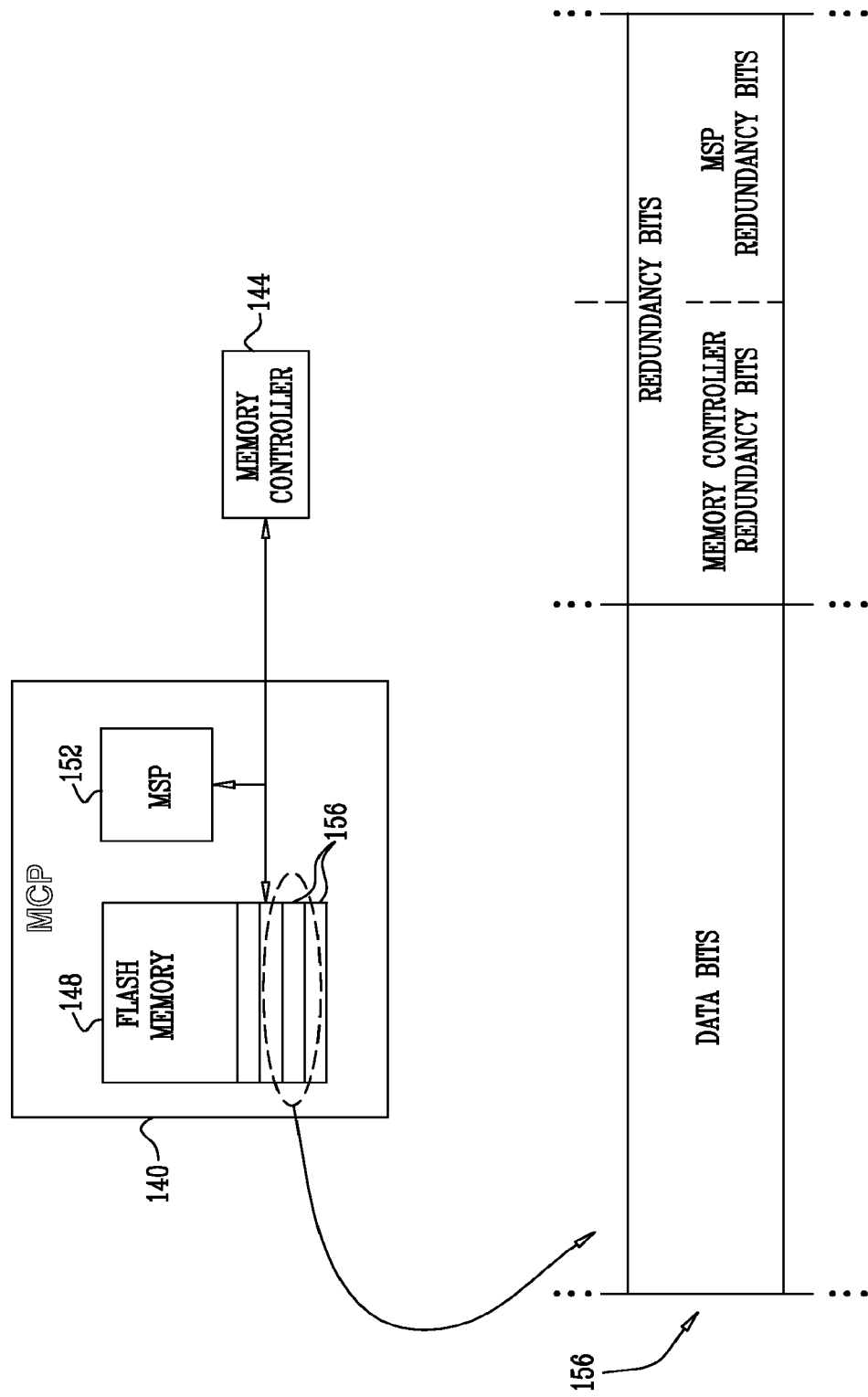
FIG. 6 is a block diagram that schematically illustrates a memory system, in accordance with an embodiment of the present invention.

FIG. 6 is a block diagram that schematically illustrates a memory system 140, which interacts with a memory controller 144, in accordance with an embodiment of the present invention. Controller 144 stores and retrieves data in and out of system 140. System 140 comprises a memory, such as one or more Flash memories 148, and an MSP 152. MSP 152 is similar in functionality to MSP 52 described above. Controller 144 may comprise a dedicated memory controller device. Alternatively, the functions of controller 144 may be carried out by a host system processor.

Typically but not necessarily, the memory and MSP are packaged together in a single Multi-Chip Package (MCP). Thus, MSP 152 is referred to as an internal controller, and controller 144 is referred to as an external controller.

The division of functions between the internal and external controllers may differ in different host systems and applications. For example, in some systems, ECC encoding and decoding is performed entirely by the external controller. In other systems, ECC is handled exclusively by the internals controller. Hybrid systems in which both internal and external controllers apply ECC are also feasible. Similarly, functions such as defect identification and substitution of defective cells may also be performed by the internal controller, the external controller, or both.

In some embodiments of the present invention, memory 148 comprises separate excess memory sections for use by the internal and external controllers. The separate excess memory sections enable sufficient operational flexibility to support various partitioning of functions between the internal and external controller.

In the example of FIG. 6, memory 148 comprises multiple pages 156. Each page 156 comprises a section of nominal data bits and a section of redundancy (excess memory) bits. The excess memory section is divided into an internal excess memory section, which is used by the internal controller, and an external memory section, which is used by the external controller.

In some embodiments, the partitioning of the overall available excess memory into the internal and external sections is derived from the requirements of the external controller. For example, assume a total of 100 bytes of excess memory is provided for each memory page. If the external controller requires 64 redundancy bytes, then the internal controller is configured to use 36 excess memory bytes for each page. If the external controller requires 16 redundancy bytes, the internal controller is configured to use the remaining 84 excess memory bytes. In the absence of an external memory controller (or when the external controller does not apply ECC), the internal controller can be configured to use the entire 100 bytes. Configuration of the amount of excess memory used by the internal controller can be carried out during production or during operation in the host system.

In some implementations, the excess memory bits used by the external memory controller comprise deterministic functions of the data bits, such as Cyclic Redundancy Check (CRC) bits or ECC parity bits. In some embodiments, MSP 152 refrains from storing these deterministic bits in memory 148, and uses this portion of the external excess memory as additional internal excess memory. When MSP 152 reads data from memory 148, the MSP regenerates the external excess memory bits by evaluating the deterministic functions of the data bits (e.g., recalculating the CRC). The MSP transfers the regenerated external excess memory bits to the external controller.

When the MSP is unable to correctly detect the data bits, it will not transfer correct values of the external excess memory bits to the external controller. As a result, the external controller is able to conclude that the retrieved data contains errors.

Since the external controller is unable to correct errors in pages that were not detected correctly by the MSP, some of the external excess memory bits may not be usable by the external controller. In such a case, the MSP can use the memory allocated to these bits in order to store more MSP redundancy bits, and transfer an arbitrary or estimated value for these bits to the external controller.

Reusing Identification of Defective Memory Cells Across Pages and Word Lines in Block In some practical scenarios, defective memory cells are caused by failure of one or more bit lines 84 in a given erasure block of memory device 24. When a bit line fails, the memory cells along this bit line, belonging to different word lines 80, will typically be defective. In such a scenario, different pages stored in the word lines in the block will have a similar pattern of defective memory cells.

In some embodiments, MSP 52 identifies the positions of one or more defective memory cells in one page stored in a certain word line 80. The MSP assumes that the defective memory cells are due to bit line failure, and therefore that corresponding memory cells in other pages in the block (in the same word line or in other word lines) will also be defective. The MSP recovers the data from another page in the block by applying the pattern of the defective memory cells that were identified in the former page. When multiple pages are stored in a single word line (e.g., when using MLC memory), positions of defective memory cells identified in a certain page can be used for recovering a second page stored in the same word line.

In an example embodiment, MSP 52 stores a respective ECC code word in each memory page of the block. When using SLC memory, each page is stored in a different word line 80. When using MLC memory, each word line may hold multiple pages. (The present description refers only to pages that are stored in corresponding bit lines 84. Configurations that store different pages in the odd-order and even-order memory cells of each word line, for example, are not addressed explicitly. The disclosed techniques, however, can be applied to such configurations, for example by applying them separately to the odd-order and/or even-order bit lines of a block.)

At a certain point in time, the MSP identifies the positions of one or more defective memory cells in a certain ECC code word. For example, the MSP may read the ECC code word from this page and identify the positions of erred bits in the code word. When decoding another code word read from another page in the same block (in the same word line or in a different word line), the MSP may mark the corresponding bit positions in the latter code word as having low decoding reliability. This marking is likely to be true when the defective memory bits are caused by bit line failure.

The MSP may mark the bit positions corresponding to defective memory cells in various ways. For example, in some embodiments signal processing unit 60 decodes the ECC using soft metrics, such as Log Likelihood Ratios (LLRs). In such embodiments, the MSP may mark the bits at the identified positions as having low soft decoding metrics that are indicative of low-reliability bits. In other embodiments, unit 60 decodes the ECC using erasure marks. In these embodiments, the MSP may mark the bits at the identified positions as erasures. In either case, marking certain code word bits as having low reliability enhances the error correction capability of unit 60.

This technique enables the MSP to recover the data from multiple pages and word lines in a given block with high performance, without having to identify defective memory cells separately for each page or word line. Thus, computational complexity is reduced without performance degradation.

In alternative embodiments, MSP 52 may store any other suitable data items in the different pages. The MSP may identify defective memory cells in a given page in any other suitable way. The MSP may apply any other suitable method for reusing the identified positions to recover the data of other pages.

Figure 7:
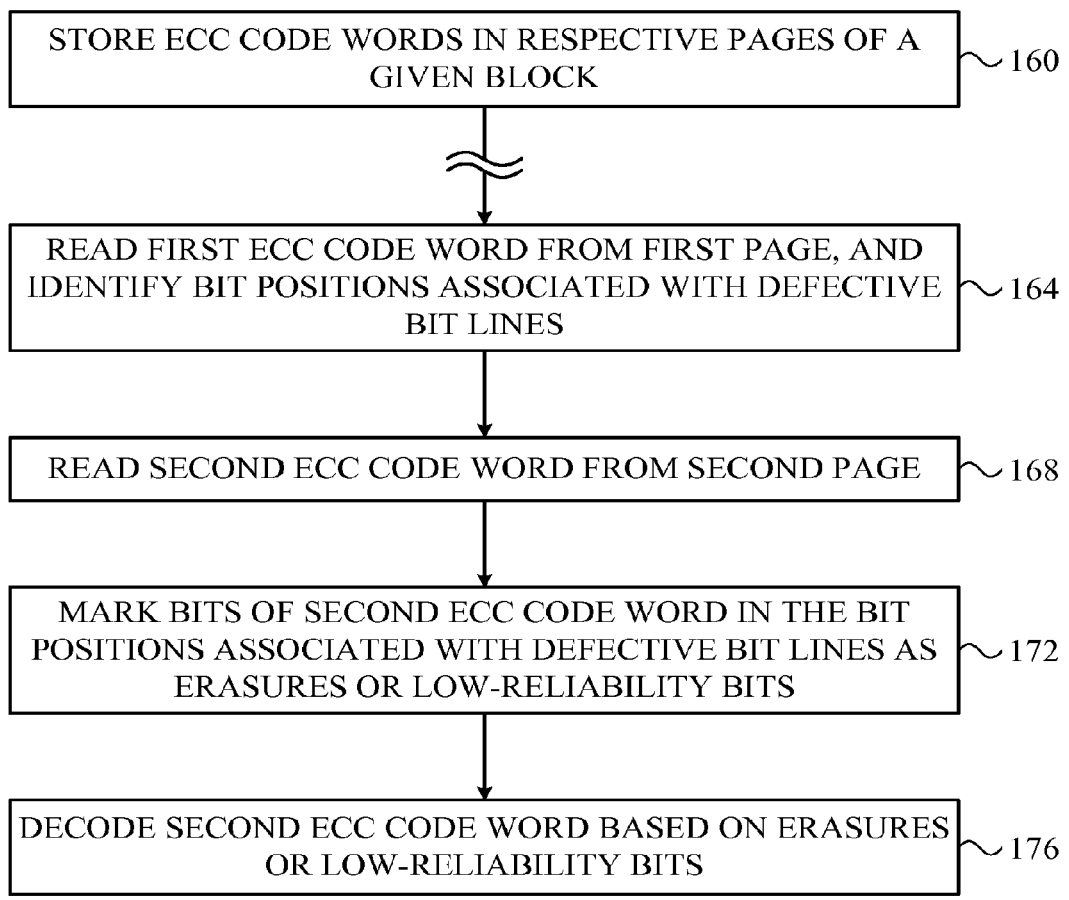
FIG. 7 is a flow chart that schematically illustrates a method for operating a memory having defective memory cells, in accordance with another embodiment of the present invention.

FIG. 7 is a flow chart that schematically illustrates a method for operating a memory having defective memory cells, in accordance with an embodiment of the present invention. The method begins with MSP 52 storing ECC code words in respective pages of a given erasure block of memory device 24, at a storage step 160. At a certain point in time, the MSP reads a first ECC code word from a first page in the block and identifies positions of one or more defective memory cells belonging to this page, at a defect identification step 164.

The MSP reads a second ECC code word from a second page in the block (in another word line or in the same word line as the first page), at a readout step 168. The MSP marks the bits of the second ECC code word, which correspond to the positions of the defective memory cells identified in the first code word, as erasures or low-reliability bits, at a marking step 172. Unit 60 in the MSP then decodes the second ECC code word based on the marked erasures or low-reliability bits, at a decoding step 176. The decoded second ECC code word is provided as output.

In some embodiments, MSP 52 carries out the techniques above after verifying that the defective memory cell are indeed due to bit line failure. The MSP may use any suitable method for distinguishing between memory cells that are defective because of bit line failure and memory cells that are defective for other reasons.

In an example embodiment, the MSP may identify that memory cells in the same position in multiple different word lines (rows) of the block are defective. In other words, the MSP may identify a similar pattern of memory cell failures in different word lines of the block. Finding a similar failure pattern in different word lines may be indicative of bit line failure, and vice versa. The confidence of identifying bit line failure typically increases with the number of word lines that exhibit the same pattern.

The MSP may identify the pattern, for example, by identifying that bits in the same position in different pages stored in different word lines are erroneous. This information can be obtained, for example, from the ECC decoding process.

Additionally or alternatively, the MSP may receive a-priori indications of faulty bit lines. These indications may originate, for example, from a production-line tester that tested memory devices 24. Such a memory tester may be capable of distinguishing between memory cells that are defective because of bit line failure and memory cells that are defective for other reasons. Further additionally or alternatively, MSP 52 may identify faulty bit lines in any other suitable way.

In some practical cases, the same block comprises one or more faulty bit lines, as well as memory cells in other bit lines that are defective for other reasons. Thus, the MSP may use the techniques described above for handling bit line failures in combination with other techniques described herein for handling defective memory cells.

Although the embodiments described herein mainly refer to defective cells that are entirely unusable for storing information, the methods and systems described herein can be generalized to identify and manage memory cells that, although defective, can still be used to store some information with reduced performance. For example, when providing an indication of a defective cell to the ECC decoding process, the indication may also relate to the level, or severity of the defect. As another example, the MSP may sometimes be able to store a smaller number of bits in a defective cell instead of skipping it. As yet another example, instead of replacing group of cells that are defective but usable, the group can be downgraded and used for storing data at a lower density. When different bits of an MLC are mapped to different pages, this action is equivalent to replacing bits in only some of the pages.

Although the embodiments described herein mainly address defect management in solid-state memory devices, the principles of the present invention can also be used for storing and retrieving data in Hard Disk Drives (HDD) and other data storage media and devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:
1. A method comprising:
a processor identifying defective memory cells within a memory device, wherein the memory device includes a plurality of multilevel memory cells each storing a plurality of bits, wherein the defective memory cells include completely defective memory cells and partially defective memory cells;
retaining information corresponding to the defective memory cells; and
the processor skipping the completely defective memory cells upon writing to and reading from the memory device and writing to the partially defective memory cells at a lower density, based upon the information corresponding to the defective memory cells.

2. The method of claim 1, wherein identifying the defective memory cells includes the processor performing memory diagnostics on the memory device.

3. The method of claim 1, wherein identifying the defective memory cells includes the processor performing normal memory operations on the memory device.

4. The method of claim 1, wherein identifying the defective memory cells includes an external testing unit performing diagnostics on the memory device.

5. The method of claim 1, wherein retaining information corresponding to the defective memory cells includes the processor storing the information within a specific segment of the memory device.

6. The method of claim 1, wherein retaining information corresponding to the defective memory cells includes the processor storing the information within another memory device.

7. The method of claim 1, wherein retaining information corresponding to the defective memory cells includes an external testing unit providing the information to the processor.

8. The method of claim 1, wherein the processor skipping the defective memory cells includes the processor writing a received data segment to a grouping of successive multilevel memory cells that includes one or more defective memory cells such that the one or more defective memory cells are not written.

9. The method of claim 1, wherein the processor skipping the defective memory cells includes the processor reading a data segment from a grouping of successive multilevel memory cells that includes one or more defective memory cells such that the one or more defective memory cells are not read.

10. The method of claim 1, wherein writing to the partially defective memory cells at a lower density includes using less than all of the plurality of bits in a given partially defective memory cell.

11. A system comprising:
a memory device including a plurality of multilevel memory cells, wherein each memory cell is configured to store a plurality of bits; and
a processor coupled to the memory device and configured to:
identify defective memory cells within the memory device wherein defective memory cells include completely defective memory cells and partially defective memory cells;
retain information corresponding to the defective memory cells;
skip the completely defective memory cells upon writing to and reading from the memory device and write to the partially defective memory cells at a lower density, based upon the information corresponding to the defective memory cells.

12. The system of claim 11, wherein the processor is further configured perform memory diagnostics on the memory device to identify the defective memory cells.

13. The system of claim 11, wherein the processor is further configured to identify the defective memory cells during normal operations.

14. The system of claim 11, wherein the processor is further configured to store the information within a specific segment of the memory device.

15. The system of claim 11, wherein the processor is further configured to store information within another memory device.

16. The system of claim 11, wherein the processor is further configured to write a received data segment to a grouping of successive multilevel memory cells that includes one or more defective memory cells and to avoid writing the one or more defective memory cells.

17. The system of claim 11, wherein the processor is further configured to read a data segment from a grouping of successive multilevel memory cells that includes one or more defective memory cells and to avoid reading the one or more defective memory cells.

18. The system of claim 11, wherein the processor is further configured to write fewer than the all of the plurality of bits to a given partially defective memory cell.

* * * * *